United States Patent
Sai (10) Patent No.: US 9,825,019 B1
(45) Date of Patent: Nov. 21, 2017

(54) SEMICONDUCTOR DEVICE (71) Applicant: KABUSHIKI KAISHA TOSHIBA, Tokyo (JP)

(72) Inventor: Hideaki Sai, Ibo Hyogo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/448,293

(22) Filed: Mar. 2, 2017

(30) Foreign Application Priority Data

Sep. 15, 2016 (JP) ................. 2016-180340

(51) Int. Cl.
H01L 27/02 (2006.01)
H01L 27/08 (2006.01)
H01L 29/06 (2006.01)

(52) U.S. Cl.
CPC ...... H01L 27/0248 (2013.01); H01L 27/0814 (2013.01); H01L 29/0646 (2013.01)

(58) Field of Classification Search
CPC ............. H01L 27/0248; H01L 27/0255; H01L 27/0814
USPC ...................................................... 361/91.5
See application file for complete search history.

(56) References Cited

U.S. PATENT DOCUMENTS 5,880,514 A * 3/1999 Nagatomo .......... H01L 27/0255
257/546
2015/0364462 A1 12/2015 Nakaiso et al.
2015/0371941 A1 12/2015 Nakaiso et al.
2016/0056142 A1 2/2016 Kaida

FOREIGN PATENT DOCUMENTS

JP 2012182381 A 9/2012
JP 5843045 B2 1/2016
JP 2016-046383 4/2016

* cited by examiner

*Primary Examiner* — Mark Prenty
(74) *Attorney, Agent, or Firm* — Patterson & Sheridan, LLP (57) ABSTRACT

A semiconductor device includes a semiconductor layer of a first conductivity type, and first and second electrodes on the layer. A first region of the first type is between the layer and the first electrode and contacting the first electrode. A second region of a second conductivity type is between the layer and the second electrode. A third region of the second type is connected to the second electrode, between the first and second regions, and between the layer and the second electrode. A fourth region of the first type is between the second region and the second electrode and contacting the second electrode. A fifth region of the second type is between the layer and the second region and has an impurity concentration greater than the second region and the third region. A sixth region of the first type is between the second region and the third region.

20 Claims, 5 Drawing Sheets

SEMICONDUCTOR DEVICE

CROSS-REFERENCE TO RELATED APPLICATION

This application is based upon and claims the benefit of priority from Japanese Patent Application No. 2016-180340, filed Sep. 15, 2016, the entire contents of which are incorporated herein by reference.

FIELD

Embodiments described herein relate generally to a semiconductor device.

BACKGROUND

In a signal transmission line, an electrostatic discharge (ESD) protection diode is provided to protect internal electronic circuits from ESD events. The ESD protection diode must have a lower capacitance as signal frequency increases.

In the ESD protection diode having an inter-terminal capacitance less than 1 pF, an electric circuit typically called a "crowbar circuit" is used. However, in recent years, the ESD protection diode has been required to be miniaturized.

DETAILED DESCRIPTION

In general, according to one embodiment, a semiconductor device comprises a semiconductor layer of a first conductivity type, a first electrode on a first side of the semiconductor layer, and a second electrode on the first side of the semiconductor layer. The second electrode is spaced from the first electrode in a first direction. A first semiconductor region of the first conductivity type is between the semiconductor layer and the first electrode in a second direction crossing the first direction. The first semiconductor region is contacting the first electrode. A second semiconductor region of a second conductivity type is between the semiconductor layer and the second electrode in the second direction and separated from the first semiconductor region in the first direction. A third semiconductor region of the second conductivity type is between the first semiconductor region and the second semiconductor region in the first direction and between the semiconductor layer and the second electrode in the second direction. The third semiconductor region is electrically connected to the second electrode. A fourth semiconductor region of the first conductivity type is between the second semiconductor region and the second electrode in the second direction and contacts the second electrode. A fifth semiconductor region of the second conductivity type is between the semiconductor layer and the second semiconductor region in the second direction. The fifth semiconductor region has an impurity concentration of the second conductivity type that is higher (greater) than an impurity concentration of the second conductivity type of the second semiconductor region and an impurity concentration of the second conductivity type of the third semiconductor region. A sixth semiconductor region of the first conductivity type is between the second semiconductor region and the third semiconductor region in the first direction.

Hereinafter, example embodiments will be described by reference to the drawings.

The same or similar components in this description will be denoted by the same reference symbols, and redundant descriptions may be omitted.

In this description, the upward direction in the drawings will be described as "up", and the downward direction of the drawings will be described as "down" in order to indicate a positional relation of components. The concept of "up" and "down" in this specification does not necessarily mean that these directions correspond with the direction of gravity.

Description will be given for an example embodiment in which the first conductivity type is an n-type and the second conductivity type is a p-type, but the disclosure is not limited to this example embodiment. In the following explanation, the notations of $n^+$, n, $n^-$, $p^+$, p, and $p^-$ indicate relative magnitudes in impurity concentration of the respective conductivity types. In other words, "$n^+$" indicates that the n-type impurity concentration is higher than "n". Also, "$n^-$" indicates that the n-type impurity concentration is lower than "n". Here, "$p^+$" indicates that the p-type impurity concentration is higher than "p," and "$p^-$" indicates that the p-type impurity concentration is lower than "p". In some cases, the "n+" and "$n^-$" types may be simply denoted by the "n" type, and the "$p^+$" and "$p^-$" types may be simply denoted by the "p" type.

First Embodiment

The semiconductor device of this first embodiment includes a substrate of the first conductivity type, a first electrode which is provided on the substrate, a second electrode which is provided on the substrate, a first semiconductor region of the first conductivity type which is provided between the substrate and the first electrode and electrically connected to the first electrode, a second semiconductor region of the second conductivity type which is provided between the substrate and the second electrode, a third semiconductor region of the second conductivity type which is provided between the first semiconductor region and the second semiconductor region and between the substrate and the second electrode and electrically connected to the second electrode, a fourth semiconductor region of the first conductivity type which is provided between the second semiconductor region and the second electrode and electrically connected to the second electrode, a fifth semiconductor region of the second conductivity type which is provided between the substrate and the second semiconductor region and has an impurity concentration of the second conductivity type higher than those in the second semiconductor region and the third semiconductor region, and a sixth semiconductor region of the first conductivity type which is provided between the second semiconductor region and the third semiconductor region.

Figure 5A:
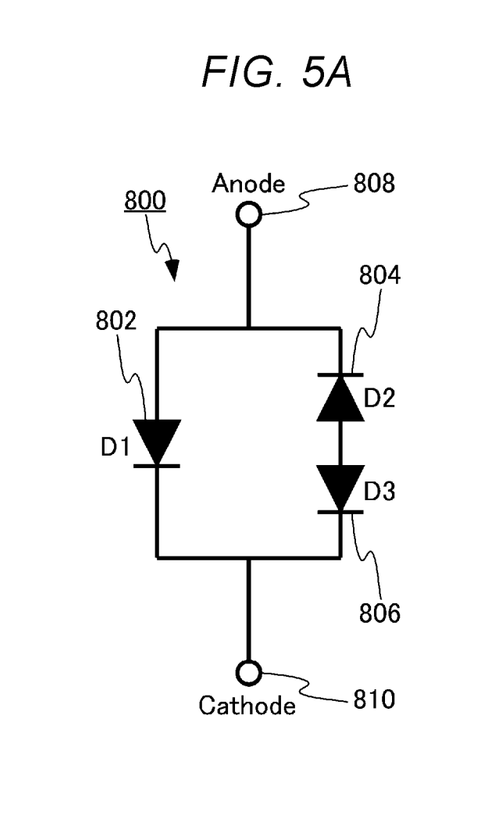
FIGS. 5A to 5C are diagrams schematically illustrating a crowbar circuit.
Figure 5B:
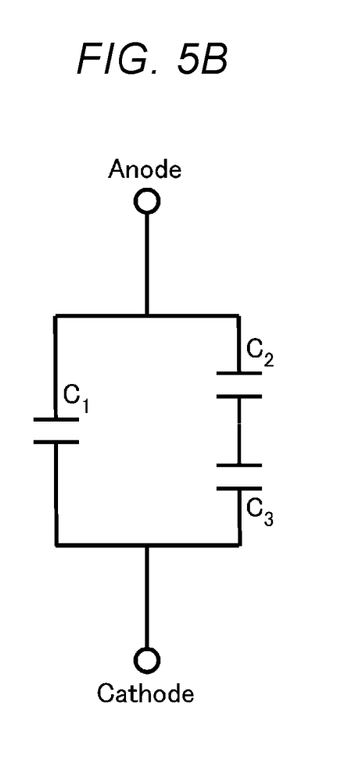
Figure 5C:
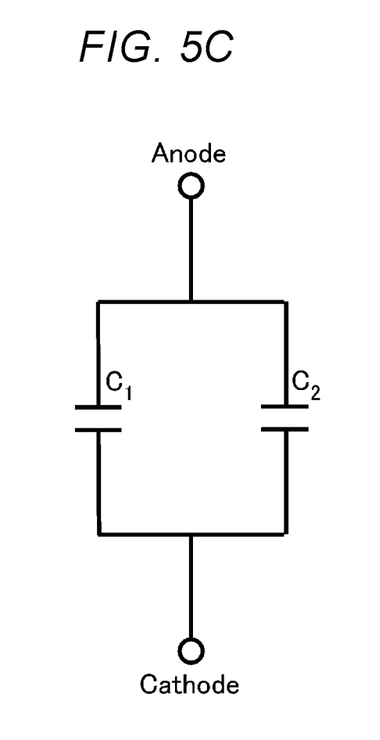

FIGS. 5A to 5C are schematic diagrams of a crowbar circuit 800. FIG. 5A illustrates diode connections in crowbar circuit 800. The crowbar circuit 800 includes a first diode 802, a second diode 804, a third diode 806, an anode electrode 808, and a cathode electrode 810.

The first diode 802 and the second diode 804 are switching diodes. The third diode 806 is a Zener diode. An ESD tolerance of the third diode 806 in the reverse bias is larger than those of the first diode 802 and the second diode 804 in the reverse bias. The ESD tolerance of the third diode 806 in the forward bias is larger than those of the first diode 802 and the second diode 804 in the forward bias.

For example, the breakdown voltages of the first diode 802 and the second diode 804 are each about 80 V to 100 V. The breakdown voltage of the third diode 806 is lower than that of the first diode 802. The breakdown voltage of the third diode 806 needs to be lower than that of the second diode 804 in order to make the capacitance of the second diode 804 small. For example, the breakdown voltage of the third diode 806 is about 5 V.

The anode of the second diode 804 and the anode of the third diode 806 are electrically connected to each other. The anode of the first diode 802 and the cathode of the second diode 804 are electrically connected to the anode electrode 808. The cathode of the first diode 802 and the cathode of the third diode 806 are electrically connected to the cathode electrode 810 respectively. The second diode 804 and the third diode 806 are connected in parallel to the first diode 802.

An ESD applied across the anode electrode 808 to the cathode electrode 810 flows through the first diode 802 in the forward bias direction. On the other hand, ESD applied across the cathode electrode 810 to the anode electrode 808 flows in the reverse bias direction of the third diode 806 since it has a low breakdown voltage, and then flows through the second diode 804 in the forward bias direction.

In general, the ESD tolerance of a diode in the forward bias direction is substantially larger than the ESD tolerance of the diode in the reverse bias direction. In the crowbar circuit 800, the first diode 802 and the second diode 804 flow ESD charges in the forward bias directions, and only the third diode 806 is designed to carry ESD charges in the reverse bias direction. With this configuration, the ESD tolerance is secured in both the forward and reverse biases of the ESD.

FIG. 5B illustrates a circuit in which the crowbar circuit 800 is redrawn based on the capacitances of the respective diodes (D1, D2, D3). The capacitance of the first diode 802 is $C_1$, the capacitance of the second diode 804 is $C_2$, and the capacitance of the third diode 806 is $C_3$.

FIG. 5C illustrates an equivalent circuit of the circuit illustrated in FIG. 5B. In a case where $C_3$ is sufficiently larger than $C_2$, the capacitance $C_3$ can be substantially ignored. In this case, the inter-terminal (anode electrode 808 to cathode electrode 810) capacitance is expressed as a sum of the capacitance $C_1$ and the capacitance $C_2$ (that is, $C_1+C_2$). Therefore, a low capacitance can be realized in the crowbar circuit 800 while still securing the ESD tolerance in both the forward bias and the reverse bias directions.

Figure 1:
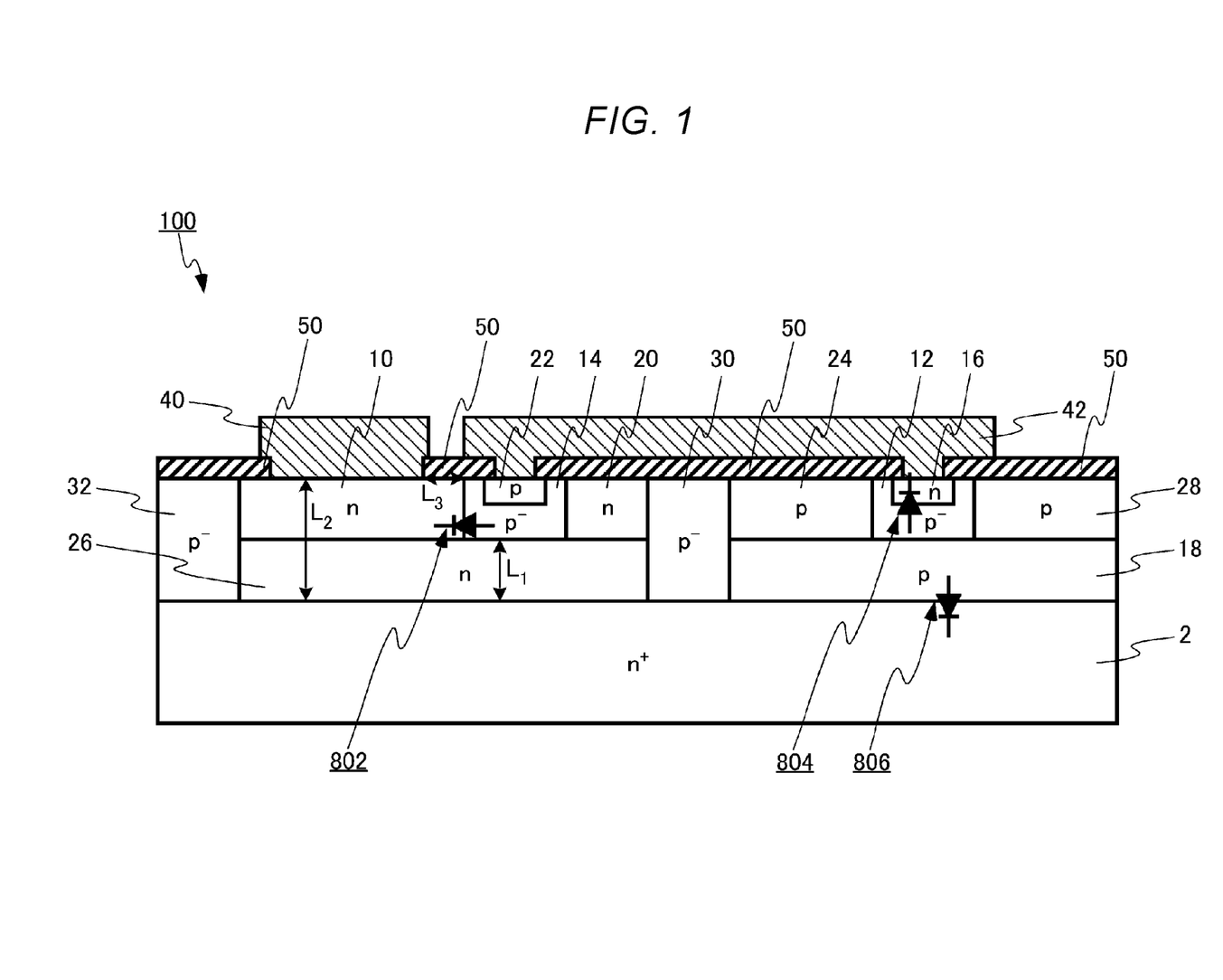
FIG. 1 is a cross-sectional view schematically illustrating a semiconductor device of a first embodiment.
Figure 2:
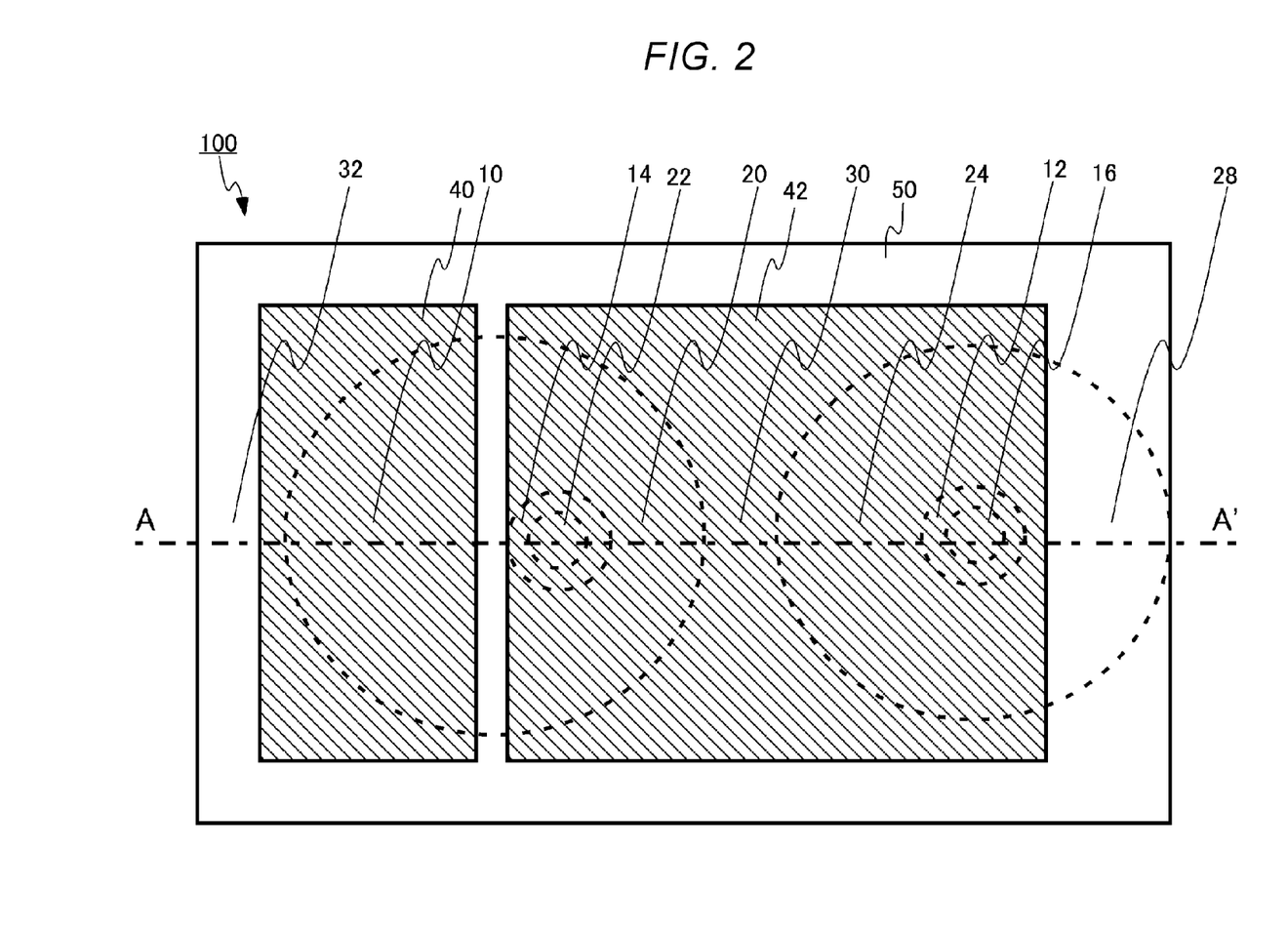
FIG. 2 is a top view schematically illustrating the semiconductor device of the first embodiment.

FIG. 1 is a cross-sectional view schematically illustrating a semiconductor device 100 of this first embodiment. FIG. 2 is a top view schematically illustrating the semiconductor device 100 of this first embodiment. The schematic cross-sectional view taken along a line A-A' of FIG. 2 corresponds to FIG. 1. The semiconductor device 100 is equivalent to the crowbar circuit 800.

The semiconductor device 100 includes an n+ type substrate layer (substrate) 2, an n-type first semiconductor region 10, a p⁻ type second semiconductor region 12, a p⁻ type third semiconductor region 14, an n-type fourth semiconductor region 16, a p-type fifth semiconductor region 18, an n-type sixth semiconductor region 20, a p-type seventh semiconductor region 22, a p-type eighth semiconductor region 24, an n-type ninth semiconductor region 26, a p-type tenth semiconductor region 28, a p⁻ type eleventh semiconductor region 30, a p⁻ type twelfth semiconductor region 32, a cathode electrode 40, an anode electrode 42, and an insulating layer 50.

The n+ type substrate layer 2 is a semiconductor material such as silicon (Si) for example. The substrate layer 2 contains the n-type impurity at a concentration of about $1\times10^{19}$ cm$^{-3}$ for example.

The cathode electrode 40 is provided on the substrate 2. The cathode electrode 40 is formed of aluminum (Al) for example. The cathode electrode 40 is an example of a first electrode.

The anode electrode 42 is provided on a side of the cathode electrode 40 on the substrate 2. The anode electrode 42 is formed of aluminum (Al) for example. The anode electrode 42 is an example of a second electrode.

The cathode electrode 40 and the anode electrode 42 can be formed by sputtering and then etching aluminum.

The n-type first semiconductor region 10 is provided between the substrate 2 and the cathode electrode 40. The first semiconductor region 10 contains the n-type impurity of at a concentration within a range of about $1\times10^{16}$ cm$^{-3}$ to about $1\times10^{18}$ cm$^{-3}$, for example. The first semiconductor region 10 is electrically connected to the cathode electrode 40.

The p⁻ type second semiconductor region 12 is provided between the substrate 2 and the anode electrode 42. The second semiconductor region 12 contains the p-type impurity at a concentration within a range of about $1\times10^{13}$ cm$^{-3}$ to about $1\times10^{15}$ cm$^{-3}$, for example. The p-type impurity concentration of the second semiconductor region 12 is low so as to increase the breakdown voltage of the second diode 804 in the reverse bias direction; this aspect will be further described below.

The p⁻ type third semiconductor region 14 is provided between the first semiconductor region 10 and the second semiconductor region 12 and between the substrate 2 and the anode electrode 42. The p⁻ type third semiconductor region 14 is electrically connected to the anode electrode 42. The third semiconductor region 14 contains p-type impurity at a concentration with a range of about $1\times10^{13}$ cm$^{-3}$ to $1\times10^{15}$ cm$^{-3}$, for example. The p-type impurity concentration of the third semiconductor region 14 is low in order to increase the breakdown voltage of the first diode 802 in the reverse bias direction; this aspect will be described further below.

The n-type fourth semiconductor region 16 is provided between the second semiconductor region 12 and the anode electrode 42. The n-type fourth semiconductor region 16 is electrically connected to the anode electrode 42. The fourth semiconductor region 16 is a contact layer provided to electrically connect the second semiconductor region 12 to the anode electrode 42. The fourth semiconductor region 16 contains the n-type impurity at concentration in a range of about $1\times10^{19}$ cm$^{-3}$ to about $1\times10^{20}$ cm$^{-3}$, for example.

The p-type fifth semiconductor region 18 is provided between the substrate 2 and the second semiconductor region 12. The p-type impurity concentration in the fifth semiconductor region 18 is higher than those in the second semiconductor region 12 and the third semiconductor region 14 (for example, $1\times10^{16}$ cm$^{-3}$ to $1\times10^{18}$ cm$^{-3}$).

The n-type sixth semiconductor region 20 is provided between the third semiconductor region 14 and the eighth semiconductor region 24. The sixth semiconductor region 20 is provided between the second semiconductor region 12 and the third semiconductor region 14. The sixth semiconductor region 20 contains n-type impurity at a concentration within a range of about $1 \times 10^{16}$ cm$^{-3}$ to $1 \times 10^{18}$ cm$^{-3}$, for example.

The p-type seventh semiconductor region 22 is provided between the third semiconductor region 14 and the anode electrode 42. The seventh semiconductor region 22 is a contact layer to electrically connect the third semiconductor region to the anode electrode 42. The p-type impurity concentration in the seventh semiconductor region 22 is higher than those in the second semiconductor region 12 and the third semiconductor region 14 (for example, about $1 \times 10^{19}$ cm$^{-3}$ to $1 \times 10^{20}$ cm$^{-3}$).

The p-type eighth semiconductor region 24 is provided between the second semiconductor region 12 and the third semiconductor region 14. The p-type impurity concentration in the eighth semiconductor region 24 is higher than those in the second semiconductor region 12 and the third semiconductor region 14 (for example, about $1 \times 10^{16}$ cm$^{-3}$ to $1 \times 10^{18}$ cm$^{-3}$).

The n-type ninth semiconductor region 26 is provided between the substrate 2 and the first semiconductor region 10, the third semiconductor region 14, and the sixth semiconductor region 20. The ninth semiconductor region 26 contains the n-type impurity at a concentration within a range of about $1 \times 10^{16}$ cm$^{-3}$ to about $1 \times 10^{18}$ cm$^{-3}$, for example.

The p-type tenth semiconductor region 28 is provided such that the second semiconductor region 12 is disposed between the seventh semiconductor region 22 and the tenth semiconductor region 28. The p-type impurity concentration in the tenth semiconductor region 28 is higher than those in the second semiconductor region 12 and the third semiconductor region 14 (for example, about $1 \times 10^{16}$ cm$^{-3}$ to about $1 \times 10^{18}$ cm$^{-3}$).

The p$^-$ type eleventh semiconductor region 30 is provided between the eighth semiconductor region 24 and the sixth semiconductor region 20 and between the fifth semiconductor region 18 and the ninth semiconductor region 26. The eleventh semiconductor region 30 contains the p-type impurity at a concentration within a range of about $1 \times 10^{13}$ cm$^{-3}$ to about $1 \times 10^{15}$ cm$^{-3}$, for example.

The p$^-$ type twelfth semiconductor region 32 is provided such that the first semiconductor region 10 is disposed between the third semiconductor region 14 and the twelfth semiconductor region 32. Also, the ninth semiconductor region 26 is disposed between the eleventh semiconductor region 30 and the twelfth semiconductor region 32. The twelfth semiconductor region 32 contains the p-type impurity at a concentration within a range of about $1 \times 10^{13}$ cm$^{-3}$ to about $1 \times 10^{15}$ cm$^{-3}$, for example.

Portions of the insulating layer 50 are provided: between the twelfth semiconductor region 32 and the cathode electrode 40; between the first semiconductor region 10 and the cathode electrode 40; between the first semiconductor region 10 and the anode electrode 42; between the third semiconductor region and the anode electrode 42; between the seventh semiconductor region 22 and the anode electrode 42; between the anode electrode 42 and the sixth semiconductor region 20, the eleventh semiconductor region 30, the eighth semiconductor region 24, the second semiconductor region 12, and the tenth semiconductor region 28; and between the fourth semiconductor region 16 and the anode electrode 42. "Between" in this context includes disposition of the insulation layer 50 (or portions thereof) between only some portions of the other stated regions, layers, or elements. The insulating layer 50 serves to electrically insulate various semiconductor regions from the electrodes (40 and 42) as necessary.

The insulating layer 50 can be formed such that UDO (undoped oxide) or BPSG (borophosphosilicate glass) is formed on a thermal oxide film (not specifically illustrated) on the semiconductor layer in which the various semiconductor regions described above have been formed. After initial formation or deposition of the insulating material, portions of this material above the first semiconductor region 10, the fourth semiconductor region 16, and the seventh semiconductor region 22 can be etched and removed to provide the insulating layer 50 as depicted in FIG. 1 and FIG. 2.

The junction of the third semiconductor region 14 and the first semiconductor region 10 forms the first diode 802 of the crowbar circuit 800. The junction of the second semiconductor region 12 and the fourth semiconductor region 16 forms the second diode 804 of the crowbar circuit 800. The junction of the fifth semiconductor region 18 and the substrate 2 forms the third diode 806 of the crowbar circuit 800. In the semiconductor device 100, the electricity flowing from the anode electrode 42 to the first diode 802 flows through the first semiconductor region 10 to reach the cathode electrode 40. The electricity flowing through the second diode 804 and the third diode 806 flows from the cathode electrode 40 through the first semiconductor region 10, the ninth semiconductor region 26, and the substrate 2, and then reaches the (cathode of) third diode 806. Thereafter (assuming the breakdown voltage of the third diode 806 is exceeded), this electricity passes through the fifth semiconductor region 18 and the second semiconductor region 12 to reach the (anode of) second diode 804. Thereafter, the electricity can pass through the fourth semiconductor region 16 and reach the anode electrode 42.

A barrier metal (not specifically illustrated) made of Ti (titanium), W (tungsten), or an alloy thereof may be provided between the semiconductor layer and the cathode electrode 40 and also between portions of the semiconductor layer (e.g., regions 16 and 22) and the anode electrode 42. The barrier metal serves to suppress diffusion of the metal(s) (e.g., aluminum) used in the cathode electrode 40 and the anode electrode 42 into the adjacent semiconductor regions.

The p$^-$ type second semiconductor region 12, the p$^-$ type third semiconductor region 14, the p type eleventh semiconductor region 30, and the p$^-$ type twelfth semiconductor region 32 can be formed by epitaxially growing silicon on the substrate 2, for example. The film thickness of a p$^-$ type layer formed by the epitaxial growth on the substrate 2 can be about 10 μm, for example. The n-type first semiconductor region 10, the n-type fourth semiconductor region 16, the p-type fifth semiconductor region 18, the n-type sixth semiconductor region 20, the p-type seventh semiconductor region 22, the p-type eighth semiconductor region 24, the n-type ninth semiconductor region 26, and the p-type tenth semiconductor region 28 can be formed by burying, for example, a silicon diffusion layer(s) in the p$^-$ type semiconductor region formed on the substrate 2 by epitaxial growth.

The n-type impurity used in the semiconductor device 100 is P (phosphorus) for example. The p-type impurity used in the semiconductor device 100 is B (boron), for example.

The sum of a first distance $L_1$ (see FIG. 1) that is from the substrate 2 to the third semiconductor region 14 and a second distance $L_2$ that is from the substrate 2 to the cathode electrode 40 is longer than a third distance $L_3$ (see FIG. 1) between the third semiconductor region 14 and the cathode electrode 40.

The eighth semiconductor region 24 and the tenth semiconductor region 28 are preferably disposed to collectively surround the second semiconductor region 12 as a ring-like structure. The first semiconductor region 10 and the sixth semiconductor region 20 are preferably provided so as to collectively surround the third semiconductor region 14 as a ring-like structure. With this configuration, it is possible to prevent a depletion layer that forms in the second semiconductor region 12 from being overlapped by a depletion layer formed in the third semiconductor region 14. As depicted in FIG. 2, the eighth semiconductor region 24 and the tenth semiconductor region 28 are formed in an integrated donut shape to surround the entire perimeter (in top-down view) of the second semiconductor region 12. As depicted in FIG. 2, the first semiconductor region 10 and the sixth semiconductor region 20 are also formed in an integrated donut shape to surround the entire perimeter (in top-down view) of the third semiconductor region 14.

The impurity concentrations, the widths, the shapes, and the film thicknesses of the semiconductor regions of this first embodiment may be measured using analytical methods such as scanning probe microscopy (SPM), scanning spreading resistance microscopy (SSRM), secondary ion mass spectrometry (SIMS), scanning capacitance microscopy (SCM), transmission electron microscope (TEM)-energy dispersive X-ray spectroscopy (EDX), or TEM-electron energy-loss spectroscopy (EELS), or a combination of these analytic methods.

Next, operational advantages of this first embodiment will be described.

An ESD protection diode using the crowbar circuit design has typically been manufactured as a molded package product. In such an ESD protection diode made as the molded package product, only anode electrode 42 is provided on the substrate 2, and the substrate 2 itself serves as the cathode electrode (or is directly in the electrical pathway from cathode electrode 40 to the cathode of first diode 802). In other words, the anode electrode 42 is provided on the upper side portion of the packaged semiconductor device, and the cathode electrode is provided on the lower side portion of the package semiconductor device. In this case, the substrate 2 is placed on a first lead frame of the molded package, and the substrate 2 and the first lead frame are electrically connected to each. A second lead frame of the molded package is electrically connected to the anode electrode 42 by a wire bonding.

However, when the size of the ESD protection diode is decreased, a molded product is difficult to manufacture. Therefore, the molded product is preferably manufactured as a LGA (Land Grid Array)-type chip (a type of surface-mount packaging). In this case, not only the anode electrode 42 but also the cathode electrode 40 would desirably be provided in the upper portion of the semiconductor device 100.

Figure 3:
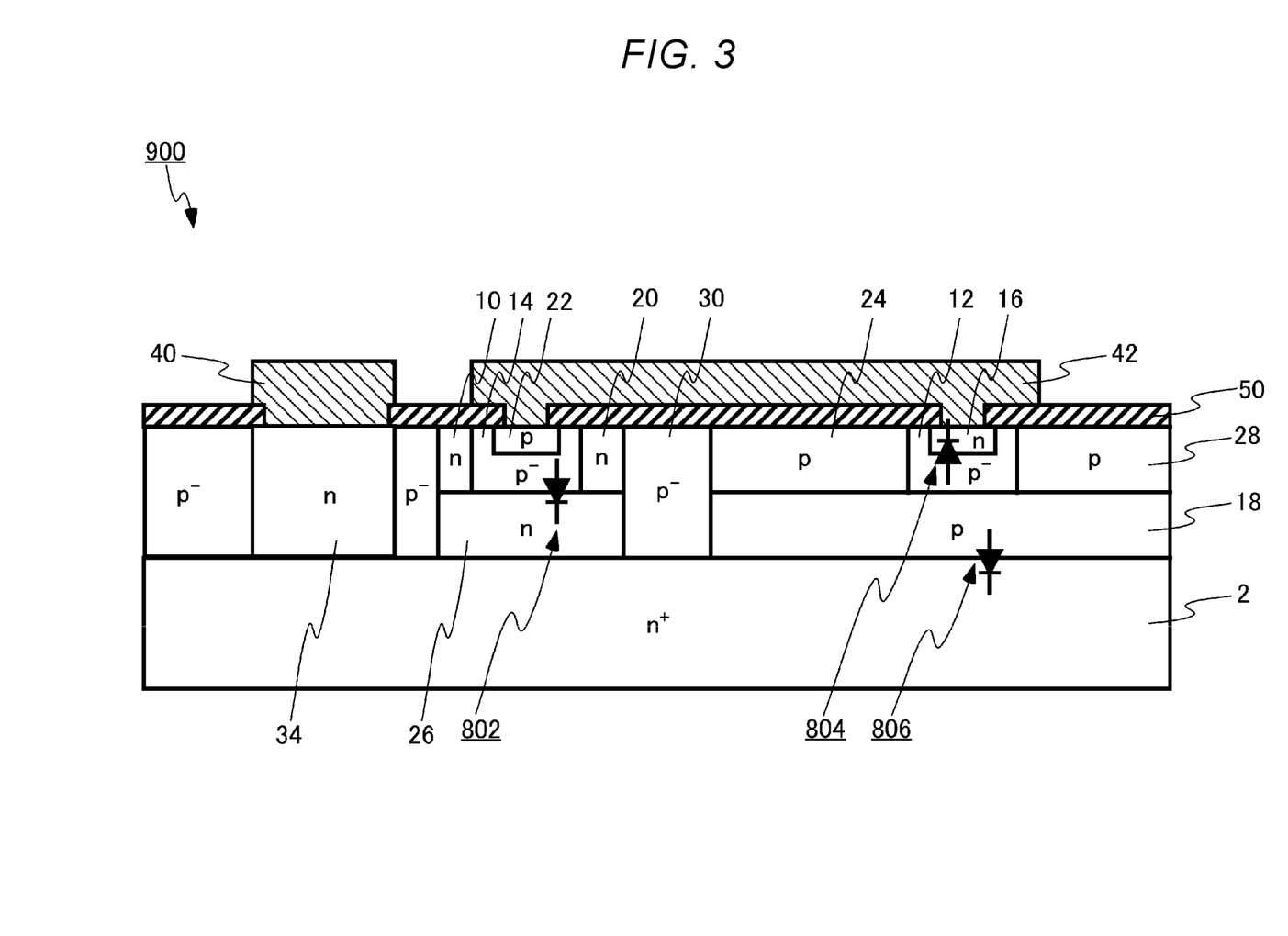
FIG. 3 is a cross-sectional view schematically illustrating the semiconductor device of a comparative example of the first embodiment.

FIG. 3 is a cross-sectional view schematically illustrating a semiconductor device 900 of a comparative example. In the semiconductor device 900, the third semiconductor region 14 and the ninth semiconductor region 26 form the first diode 802 of the crowbar circuit 800. Then, a thirteenth semiconductor region 34 is provided on the substrate 2. In this comparative example, the cathode electrode 40 and the substrate 2 is used to electrically connect the cathode electrode 40 to the cathode of the first diode 802. In this manner, the anode electrode 42 and the cathode electrode 40 can be provided in the upper portion of the semiconductor device 900.

However, since a diffusion-type layer such as the thirteenth semiconductor region 34 typically has a large resistance, the dynamic resistance of the crowbar circuit 900 is increased (as compared to the first embodiment), and the protection circuit characteristics are degraded.

The second semiconductor region 12 and the third semiconductor region 14 are preferably made to have the same volume as each other in order to make the capacitance of the first diode 802 and the second diode 804 small by forming a large depletion layer. However, in this case, it will be difficult to reduce the film thicknesses of the second semiconductor region 12 and the third semiconductor region 14, and thus the required film thickness for the thirteenth semiconductor region 34 is larger. Therefore, the dynamic resistance of the crowbar circuit 900 becomes large, and the protection circuit characteristics are degraded.

If a conductive material such as metal or polysilicon was provided in place of the thirteenth semiconductor region 34 to decrease resistance associated with the thirteenth semiconductor region 34, then there would a problem in that a manufacturing process required for such an arrangement becomes complicated.

In the semiconductor device 100 of the first embodiment, the third semiconductor region 14 and the first semiconductor region 10 form the first diode 802. In other words, the first diode 802 is provided in parallel with the surface of the substrate 2 in the semiconductor device 100. With this configuration, the electricity flowing through the first diode 802 can reach the cathode electrode 40 without flowing through the ninth semiconductor region 26 and the substrate 2. Therefore, it is possible to provide a semiconductor device 100 in which the dynamic resistance is low or reduced as compared to the semiconductor device 900.

The electricity from the anode electrode 42 to the third semiconductor region 14 may easily enter the first semiconductor region 10 directly without flowing through the ninth semiconductor region 26 and the substrate 2 by setting the sum of the first distance $L_1$ (between the substrate 2 and the third semiconductor region 14) and the second distance $L_2$ (between the substrate 2 and the cathode electrode 40) to be larger than the third distance $L_3$ (between the third semiconductor region 14 and the cathode electrode 40). With this configuration, the junction between the third semiconductor region 14 and the first semiconductor region 10 serves as the first diode 802. Furthermore, it is possible to provide the semiconductor device 100 in which the dynamic resistance is further reduced.

The eighth semiconductor region 24 and the tenth semiconductor region 28 are provided to surround or encircle the second semiconductor region 12. Similarly, the first semiconductor region 10 and the sixth semiconductor region 20 surround or encircle the third semiconductor region 14. Therefore, it is possible to prevent the depletion layer formed in the second semiconductor region 12 from overlapping with the depletion layer formed in the third semiconductor region 14.

Thus, according to the semiconductor device 100 of this first embodiment, it is possible to provide the semiconductor device in which the dynamic resistance is further reduced as compared to the comparative example.

Second Embodiment

A semiconductor device 200 according to this second embodiment includes the first semiconductor region of the first conductivity type, the second semiconductor region of the second conductivity type, the third semiconductor region of the second conductivity type which is provided between the first semiconductor region and the second semiconductor region, the first electrode which is provided on the first semiconductor region and electrically connected to the first semiconductor region, the second electrode which is provided on the second semiconductor region and the third semiconductor region and electrically connected to the third semiconductor region, the fourth semiconductor region of the first conductivity type which is provided between the second semiconductor region and the second electrode and electrically connected to the second electrode, the fifth semiconductor region of the second conductivity type which is provided between the second semiconductor region and the third semiconductor region and has the impurity concentration of the second conductivity type higher than those in the second semiconductor region and the third semiconductor region, and the sixth semiconductor region of the first conductivity type which is provided between the third semiconductor region and the fifth semiconductor region and electrically connected to the first electrode. The descriptions of element or aspects overlapping with the first embodiment may be omitted.

Figure 4:
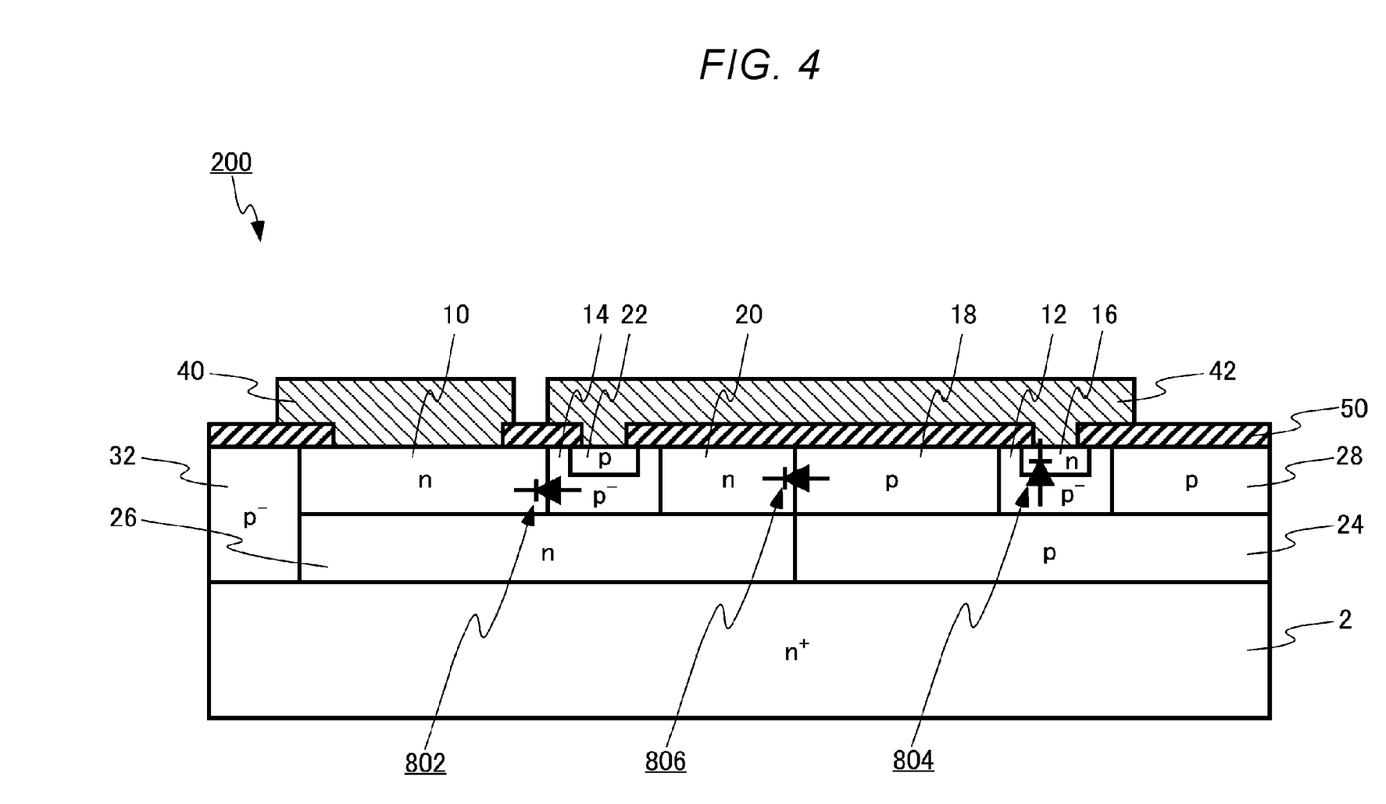
FIG. 4 is a cross-sectional view schematically illustrating a semiconductor device of a second embodiment.

FIG. 4 is a cross-sectional view schematically illustrating the semiconductor device 200 of this second embodiment.

The fifth semiconductor region 18 in the first embodiment can be considered to correspond to the eighth semiconductor region 24 in this second embodiment. And the eighth semiconductor region 24 in the first embodiment can be considered to correspond to the fifth semiconductor region 18 in this second embodiment.

In the semiconductor device 200, the junction between the third semiconductor region 14 and the first semiconductor region 10 forms the first diode 802. The junction between the fifth semiconductor region 18 and the sixth semiconductor region 20 form the third diode 806. With this configuration, the first diode 802 and the third diode 806 are provided in layers which are in parallel with a surface of substrate 2.

The cathode electrode 40 and the sixth semiconductor region 20 are electrically connected. Therefore, the electricity flowing from the cathode electrode 40 flows through the sixth semiconductor region 20 to the cathode of the third diode 806. With this configuration, the electricity does not substantially flow through the substrate 2, the eighth semiconductor region 24, or the ninth semiconductor region 26, and thus it is possible to reduce the dynamic resistance still more.

For example, the cathode electrode 40 and the sixth semiconductor region 20 are electrically connected to each other through the first semiconductor region 10, as illustrated in FIG. 2, such that the first semiconductor region 10 and the sixth semiconductor region 20 can be formed in an integrated donut shape surrounding the third semiconductor region 14. That is, the first semiconductor region 10 and the sixth semiconductor region 20 are provided to so as to surround the perimeter (top-down view) of the third semiconductor region 14 in a ring-like structure.

According to the semiconductor device 200 of this second embodiment, it is possible to provide the semiconductor device of which the dynamic resistance is reduced still more.

While certain embodiments and examples have been described, these embodiments and examples have been presented by way of example only, and are not intended to limit the scope of the disclosure. Indeed, the novel embodiments described herein may be embodied in a variety of other forms; furthermore, various omissions substitutions and changes in the form of the embodiments described herein may be made without departing from the spirit of the disclosure. The accompanying claims and their equivalents are intended to cover such embodiments or modifications as would fall within the scope and spirit of the disclosure.

What is claimed is:

1. A semiconductor device, comprising:
    a semiconductor layer of a first conductivity type;
    a first electrode on a first side of the semiconductor layer;
    a second electrode on the first side of the semiconductor layer and spaced from the first electrode in a first direction;
    a first semiconductor region of the first conductivity type between the semiconductor layer and the first electrode in a second direction crossing the first direction, the first semiconductor region contacting the first electrode;
    a second semiconductor region of a second conductivity type between the semiconductor layer and the second electrode in the second direction and separated from the first semiconductor region in the first direction;
    a third semiconductor region of the second conductivity type between the first semiconductor region and the second semiconductor region in the first direction and between the semiconductor layer and the second electrode in the second direction, the third semiconductor region being electrically connected to the second electrode;
    a fourth semiconductor region of the first conductivity type between the second semiconductor region and the second electrode in the second direction and contacting the second electrode;
    a fifth semiconductor region of the second conductivity type between the semiconductor layer and the second semiconductor region in the second direction, the fifth semiconductor region having an impurity concentration of the second conductivity type that is higher than an impurity concentration of the second conductivity type of the second semiconductor region and an impurity concentration of the second conductivity type of the third semiconductor region; and
    a sixth semiconductor region of the first conductivity type between the second semiconductor region and the third semiconductor region in the first direction.

2. The semiconductor device according to claim 1, wherein
    the first semiconductor region and the third semiconductor region directly contact each other,
    the second semiconductor region and the fourth semiconductor region directly contact each other, and
    the fifth semiconductor region directly contacts the semiconductor layer.

3. The semiconductor device according to claim 2, further comprising:
    a seventh semiconductor region of the second conductivity type between the second electrode and the semiconductor layer in the second direction and between the second semiconductor region and the third semiconductor region in the first direction, the seventh semiconductor region having an impurity concentration of the second conductivity type that is lower than the impurity concentration of the second conductivity type of the second semiconductor region and the impurity concentration of the second conductivity type of the third semiconductor region.

4. The semiconductor device of claim 1, wherein the first and sixth semiconductor regions are sub-portions of a ring-like structure that surrounds the third semiconductor region within a plane parallel to the first side of the semiconductor layer.

5. The semiconductor device of claim 1, wherein a portion of the fifth semiconductor region is between the second semiconductor region and the sixth semiconductor region in the first direction.

6. The semiconductor device of claim 5, wherein the fifth semiconductor region and sixth semiconductor region directly contact other.

7. The semiconductor device of claim 6, wherein the fifth semiconductor region is a sub-portion of a ring-like structure that surrounds the second semiconductor region within a plane parallel to the first side of the semiconductor layer.

8. The semiconductor device according to claim 1, wherein a sum of a first distance from the semiconductor layer to the third semiconductor region along the second direction and a second distance from the semiconductor layer to the first electrode is greater than a third distance from the third semiconductor region to the first electrode in the first direction.

9. The semiconductor device according to claim 1, further comprising:
    a seventh semiconductor region of the second conductivity type between the third semiconductor region and the second electrode in the second direction and having an impurity concentration of the second conductivity type that is higher than the impurity concentration of the second conductivity type of the second semiconductor region and the impurity concentration of the second conductivity type of the third semiconductor region, the seventh semiconductor region contacting the second electrode.

10. A semiconductor device, comprising:
    a first electrode on a first side of a substrate;
    a second electrode on the first side of the substrate and spaced from the first electrode in a first direction;
    a first semiconductor region of a first conductivity type electrically connected to the first electrode;
    a second semiconductor region of a second conductivity type separated from the first semiconductor region in the first direction;
    a third semiconductor region of the second conductivity type between the first semiconductor region and the second semiconductor region in the first direction and electrically connected to the second electrode;
    a fourth semiconductor region of the first conductivity type between the second semiconductor region and the second electrode and electrically connected to the second electrode;
    a fifth semiconductor region of the second conductivity type between the second semiconductor region and the third semiconductor region in the first direction and having an impurity concentration of the second conductivity type that is higher than an impurity concentration of the second conductivity type of the second semiconductor region and an impurity concentration of the second conductivity type of the third semiconductor region; and
    a sixth semiconductor region of the first conductivity type between the third semiconductor region and the fifth semiconductor region in the first direction and electrically connected to the first electrode.

11. The semiconductor device according to claim 10, further comprising:
    a seventh semiconductor region of the second conductivity type between the third semiconductor region and the second electrode and having an impurity concentration of the second conductivity type that is higher than the impurity concentration of the second conductivity type of the second semiconductor region and the impurity concentration of the second conductivity type of the third semiconductor region, the seventh semiconductor region being electrically connected to the second electrode.

12. The semiconductor device of claim 11, wherein the seventh semiconductor region is electrically connected to the first electrode via the first semiconductor region.

13. The semiconductor device of claim 12, wherein
    the first semiconductor region and the third semiconductor region directly contact each other,
    the second semiconductor region and the fourth semiconductor region directly contact each other, and
    the fifth semiconductor region directly contacts the sixth semiconductor region.

14. The semiconductor device of claim 10, wherein
    the first semiconductor region and the third semiconductor region directly contact each other,
    the second semiconductor region and the fourth semiconductor region directly contact each other, and
    the fifth semiconductor region directly contacts the sixth semiconductor region.

15. The semiconductor device according to claim 10, further comprising:
    a semiconductor layer of the first conductivity type directly contacting the fifth semiconductor region and electrically connected to the first electrode, the fifth semiconductor region being between the semiconductor layer and the second electrode in a second direction crossing the first direction; and
    a seventh semiconductor region of the second conductivity type on the semiconductor layer and between the fifth and sixth semiconductor regions in the first direction, the seventh semiconductor layer have an impurity concentration of the second conductivity type that is lower than the impurity concentration of the second conductivity type of the fifth semiconductor region.

16. An electrostatic protection device, comprising:
    a semiconductor layer of a first conductivity type;
    a first electrode on a first side of the semiconductor layer;
    a second electrode on the first side of the semiconductor layer and spaced from the first electrode in a first direction;
    a first semiconductor region of the first conductivity type adjacent to the semiconductor layer in a second direction and between the first electrode and the semiconductor layer in the second direction and between a first portion of the second electrode and the semiconductor layer in the second direction;
    a second semiconductor region of a second conductivity type adjacent to the semiconductor layer in the second direction and between a second portion of the second electrode and the semiconductor layer in the second direction;
    a third semiconductor region of the first conductivity adjacent the first semiconductor region in the second direction and contacting the first electrode;
    a fourth semiconductor region of the second conductivity type between the semiconductor layer and the second portion of the second electrode in the second direction and separated from the third semiconductor region in the first direction, an impurity concentration of the fourth semiconductor region being less than an impurity concentration of the second semiconductor region;
    a fifth semiconductor region of the first conductivity type between fourth semiconductor region and the second portion of the second electrode, the fifth semiconductor region being adjacent to the fourth semiconductor region and contacting the second portion of the second electrode;

a sixth semiconductor region of the second conductivity type between the first semiconductor region and the first portion of the second electrode in the second direction and electrically contacting the second electrode, the sixth semiconductor region being adjacent to the third semiconductor region in the first direction, an impurity concentration of the sixth semiconductor region being less than the impurity concentration of the second semiconductor region; and a seventh semiconductor region of the first conductivity type between the sixth semiconductor region and the fourth semiconductor region in the first direction, the seventh semiconductor region being adjacent the sixth semiconductor region in the first direction.

17. The electrostatic protection device according to claim 16, wherein a sum of a first distance from the semiconductor layer to the sixth semiconductor region along the second direction and a second distance from the semiconductor layer to the first electrode is greater than a third distance from the sixth semiconductor region to the first electrode, the third distance being a shortest distance between the sixth semiconductor region and the first electrode.

18. The electrostatic protection device according to claim 16, wherein the second and seventh semiconductor regions directly contact each other.

19. The electrostatic protection device according to claim 18, wherein the third and fifth semiconductor regions are directly connected to each other.

20. The electrostatic protection device according to claim 16, further comprising:

an eighth semiconductor region of the second conductivity type between the second and seventh semiconductor regions along the first direction, the eighth semiconductor region having an impurity concentration less than the impurity concentration of the second semiconductor region.

* * * * *